US007642941B2

(12) United States Patent
Tsai et al.

(10) Patent No.: US 7,642,941 B2
(45) Date of Patent: Jan. 5, 2010

(54) GAMMA REFERENCE VOLTAGES GENERATING CIRCUIT

(75) Inventors: Yao-Jen Tsai, Nantou County (TW); Chi-Lun Hung, Kaohsiung (TW)

(73) Assignee: Himax Display, Inc., Tainan County (TW)

( * ) Notice: Subject to any disclaimer, the term of this patent is extended or adjusted under 35 U.S.C. 154(b) by 45 days.

(21) Appl. No.: 12/165,064

(22) Filed: Jun. 30, 2008
(Under 37 CFR 1.47)

(65) Prior Publication Data

US 2009/0207062 A1 Aug. 20, 2009

(30) Foreign Application Priority Data

Feb. 20, 2008 (TW) .............................. 97105933 A

(51) Int. Cl.
*H03M 1/84* (2006.01)
*G09G 5/10* (2006.01)

(52) U.S. Cl. ........................ 341/138; 341/144; 345/690

(58) Field of Classification Search ................. 341/138, 341/144; 345/204, 690, 692
See application file for complete search history.

(56) References Cited

U.S. PATENT DOCUMENTS

| | | | | |
|---|---|---|---|---|
| 7,511,693 | B2 * | 3/2009 | Kudo et al. | 345/690 |
| 7,595,776 | B2 * | 9/2009 | Hashimoto et al. | 345/690 |
| 2004/0179027 | A1 * | 9/2004 | Nakai et al. | 345/690 |
| 2005/0057482 | A1 | 3/2005 | Youngblood et al. | |
| 2006/0023001 | A1 * | 2/2006 | Sung et al. | 345/690 |
| 2009/0040244 | A1 * | 2/2009 | Lee et al. | 345/690 |
| 2009/0153593 | A1 * | 6/2009 | Lee et al. | 345/690 |

* cited by examiner

*Primary Examiner*—Howard Williams
(74) *Attorney, Agent, or Firm*—J.C. Patens

(57) ABSTRACT

A gamma reference voltages generating circuit is disclosed in the present invention. The gamma reference voltages generating circuit comprises a voltage provider, a plurality of first digital-to-analog converters and a plurality of second digital-to-analog converters. The voltage provider generates a plurality of first supply voltages and a plurality of second supply voltages according to a first gamma reference voltage. The first digital-to-analog converters are electrically coupled to the first supply voltages for generating a plurality of second gamma reference voltages. The second digital-to-analog converters are electrically coupled to the second supply voltages for generating a plurality of third gamma reference voltages.

9 Claims, 6 Drawing Sheets

GAMMA REFERENCE VOLTAGES GENERATING CIRCUIT

CROSS-REFERENCE TO RELATED APPLICATION

This application claims the priority benefit of Taiwan application serial no. 97105933, filed on Feb. 20, 2008. The entirety of the above-mentioned patent application is hereby incorporated by reference herein and made a part of specification.

BACKGROUND OF THE INVENTION

1. Field of the Invention

The present invention relates to a voltage generating circuit, and more particularly to a gamma reference voltages generating circuit.

2. Description of Related Art

Currently, a large number of products in the market for displaying images such as Thin Film Transistor Liquid Crystal Display (TFT-LCD) or Liquid Crystal on Silicon Liquid Crystal Display (LCoS-LCD) frequently use a gamma curve to calibrate the quality of display image. For example, when a liquid crystal display needs to display an image signal, a driving voltage corresponding to the image signal must be applied to drive the liquid crystals so as to rotate the liquid crystals to a definite angle. However, the relationship between the magnitude of the driving voltage and the effect of the subsequent rotation of the liquid crystals on human eye perception is non-linear. Therefore, in order for the human eyes to receive information produced by an image signal, a gamma curve designed to adjust the relation between the image signal and the driving voltage is required.

More specifically, the gamma curve modifies the characteristic conversion ratio curve of a liquid crystal material so that the human eye can identify the level of brightness of a display panel. To display high quality images, the gamma curve calibration can aim for a higher contrast and a higher gray scale resolution. In general, different gamma curves can strengthen and express the characteristic quality of the image so as to optimize the visual effect of the display.

FIG. 1 is a diagram of a conventional gamma reference voltages generating circuit. As shown in FIG. 1, a conventional gamma reference voltages generating circuit comprises a resistor string (RS), 19 10-bit digital-to-analog converters (DAC) 110~128, 19 output buffers 130~148 and a digital circuit control interface (such as an I2C interface) 150. FIG. 2 is a schematic three-dimensional view of the circuit in FIG. 1. In FIG. 2, the digital-to-analog converters and the output buffers are drawn in three dimensions so as to highlight their numbers.

As shown in FIGS. 1 and 2, each of the 10-bit digital-to-analog converters 110~128 comprises a 9-bit PMOS digital-to-analog converter and a 9-bit NMOS digital-to-analog converter. Therefore, the present circuit requires a total of 19*2=38 9-bit digital-to-analog converters.

The gamma reference voltages comprise a first gamma reference voltage Vcom, second gamma reference voltages GM1~GM9 and third gamma reference voltages GM10~GM18. The steps for producing the gamma reference voltages are as follows. The divided voltages provided by the resistor string RS are output to the 10-bit digital-to-analog converters 110~128 through conductive wires H0_0~H1023_0. The digital circuit control interface 150 provides control signals to the 10-bit digital-to-analog converters 110~128. According to the 1024 levels between the first source voltage VH to the second source voltage VL, each of the 10-bit digital-to-analog converters 110~128 decodes to produce the first gamma reference voltage Vcom, the second gamma reference voltages GM1~GM9 and the third gamma reference voltages GM10~GM18 respectively. The decoded voltages are input to the output buffers 130~148 through the conductive wires 160_1~160_19 so as to output the gamma reference voltages.

In the conventional technique, each gamma reference voltage is generated by the same mechanism so that a lot of useful layout area is wasted.

SUMMARY OF THE INVENTION

Accordingly, the present invention is to provide a gamma reference voltages generating circuit that occupy comparatively smaller layout area of digital-to-analog converters, lower the circuit fabrication cost, improve yield and maintain full range decoding as in the conventional structure.

As embodied and broadly described herein, the invention provides a gamma reference voltages generating circuit comprising a voltage provider, a first digital-to-analog converter and a second digital-to-analog converter. The voltage provider generates a first supply voltage and a second supply voltage according to a first gamma reference voltage. The first digital-to-analog converter is electrically coupled to the first supply voltage for generating a second gamma reference voltage. The second digital-to-analog converter is electrically coupled to the second supply voltage for generating a third gamma reference voltage.

In the present invention, different digital-to-analog converter structures are provided according to the voltage range. Therefore, the required number of corresponding digital-to-analog converters is only about half that of the conventional structure and yet the advantage of full range decoding is maintained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
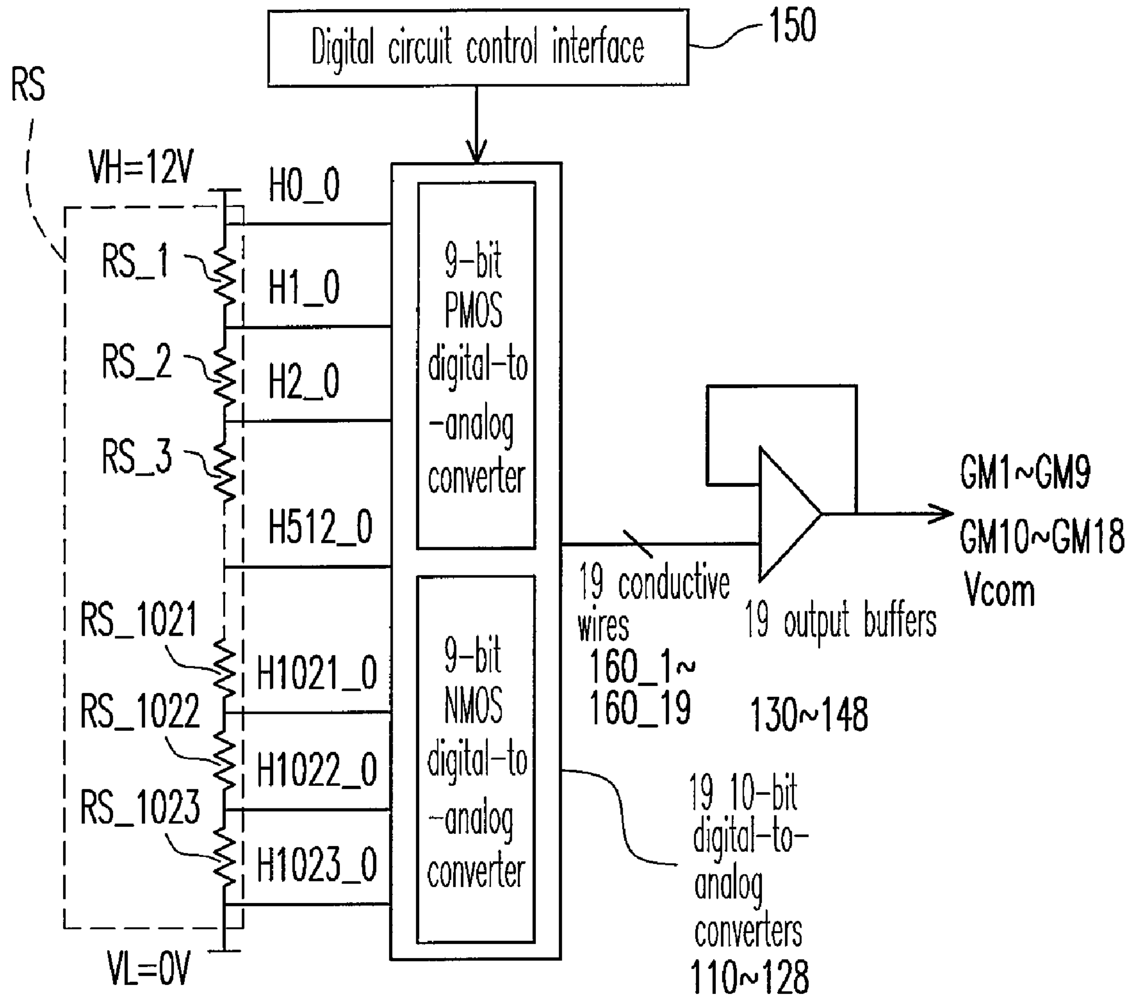
FIG. 1 is a diagram of a conventional gamma reference voltages generating circuit.
Figure 2:
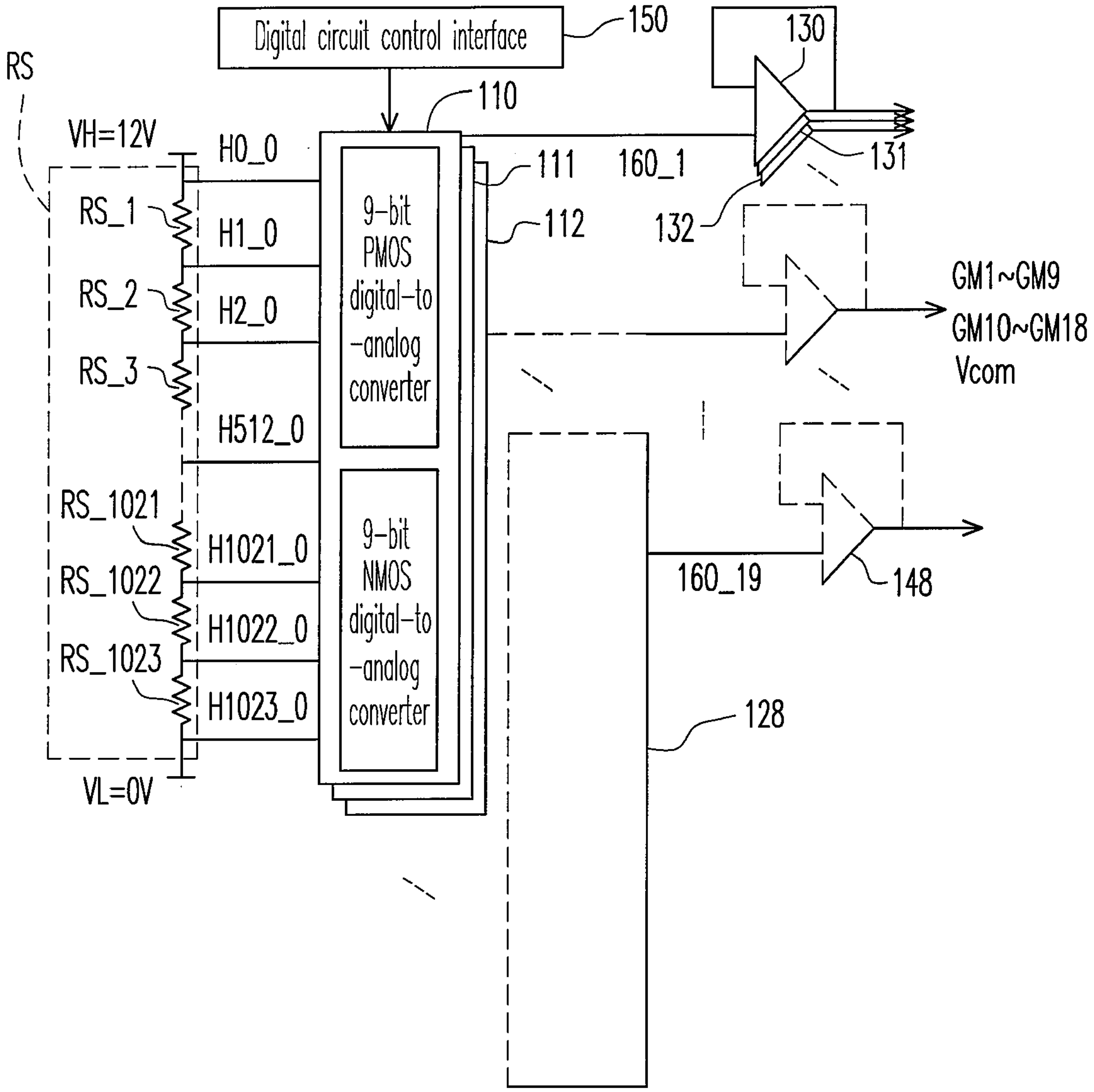
FIG. 2 is a schematic three-dimensional view of the circuit in FIG. 1.

Reference will now be made in detail to the present preferred embodiments of the invention, examples of which are illustrated in the accompanying drawings. Wherever possible, the same reference numbers are used in the drawings and the description to refer to the same or like parts.

Figure 3:
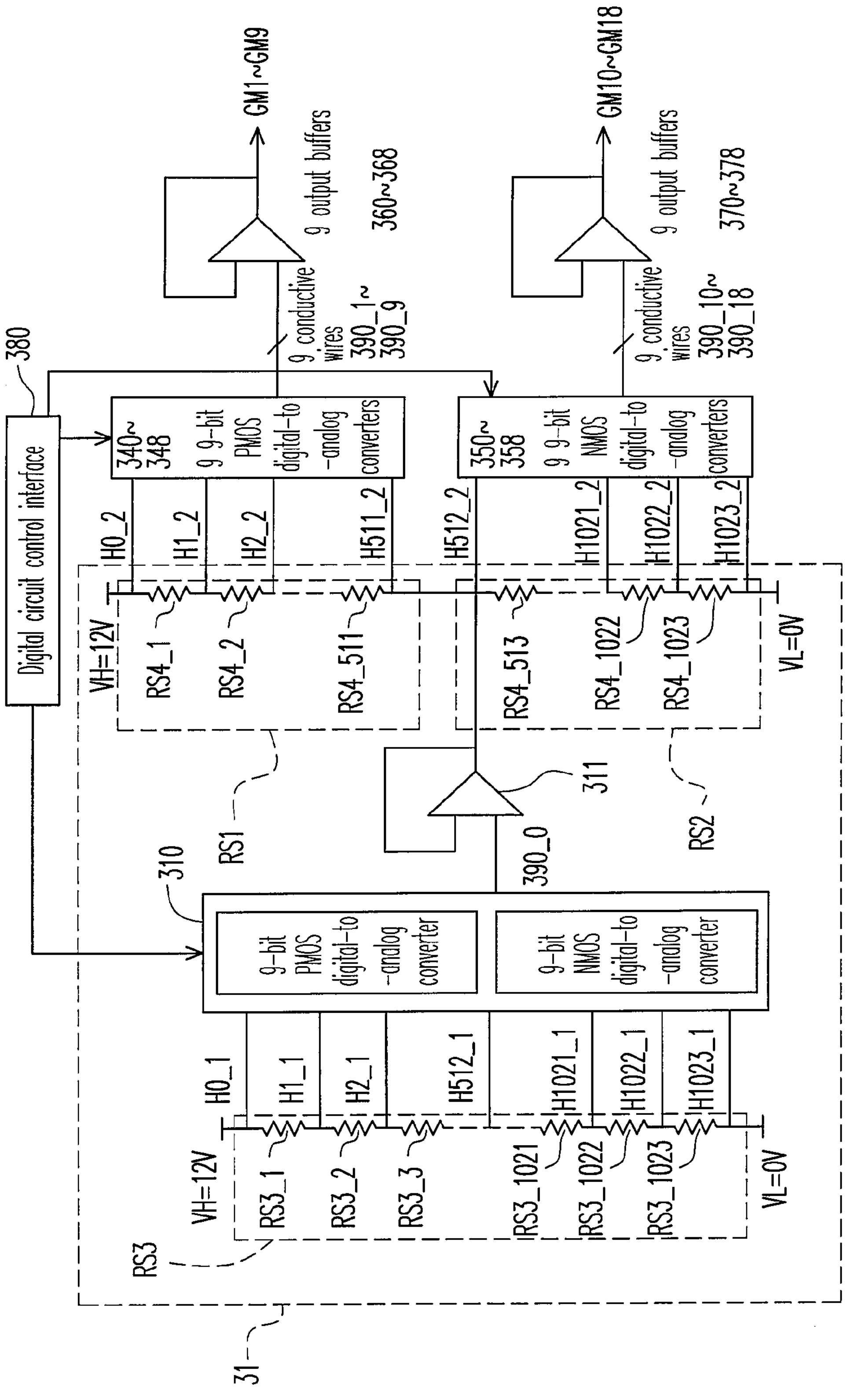
FIG. 3 is a diagram of a gamma reference voltages generating circuit according to an embodiment of the present invention.

FIG. 3 is a diagram of a gamma reference voltages generating circuit according to an embodiment of the present invention. The gamma reference voltages generating circuit comprises a voltage provider 31, a plurality of first digital-to-analog converters 340~348, a plurality of second digital-to-analog converters 350~358 and a third digital-to-analog converter 310. The voltage provider 31 comprises the 10-bit digital-to-analog converter 310, an output buffer 311, a first resistor string RS1, a second resistor string RS2 and a third resistor string RS3. The 10-bit digital-to-analog converter 310, the output buffer 311 and the third resistor string RS3 provide the first gamma reference voltage Vcom. The first resistor string RS1 serves as a secondary voltage provider for providing voltages to the first digital-to-analog converters 340~348, and the second resistor string RS2 serves as a secondary voltage provider for providing voltages to the second digital-to-analog converters 350~358.

The voltage provider 31 is electrically coupled to a first source voltage VH and a second source voltage VL. The first resistor string RS1 is electrically coupled to the first source voltage VH and the second resistor string RS2 is electrically coupled to the second source voltage VL and the first gamma reference voltage Vcom. Furthermore, the first resistor string RS1 is coupled to the second resistor string RS2. The two ends of the third resistor string RS3 are coupled to the first source voltage VH and the second source voltage VL respectively.

Figure 4:
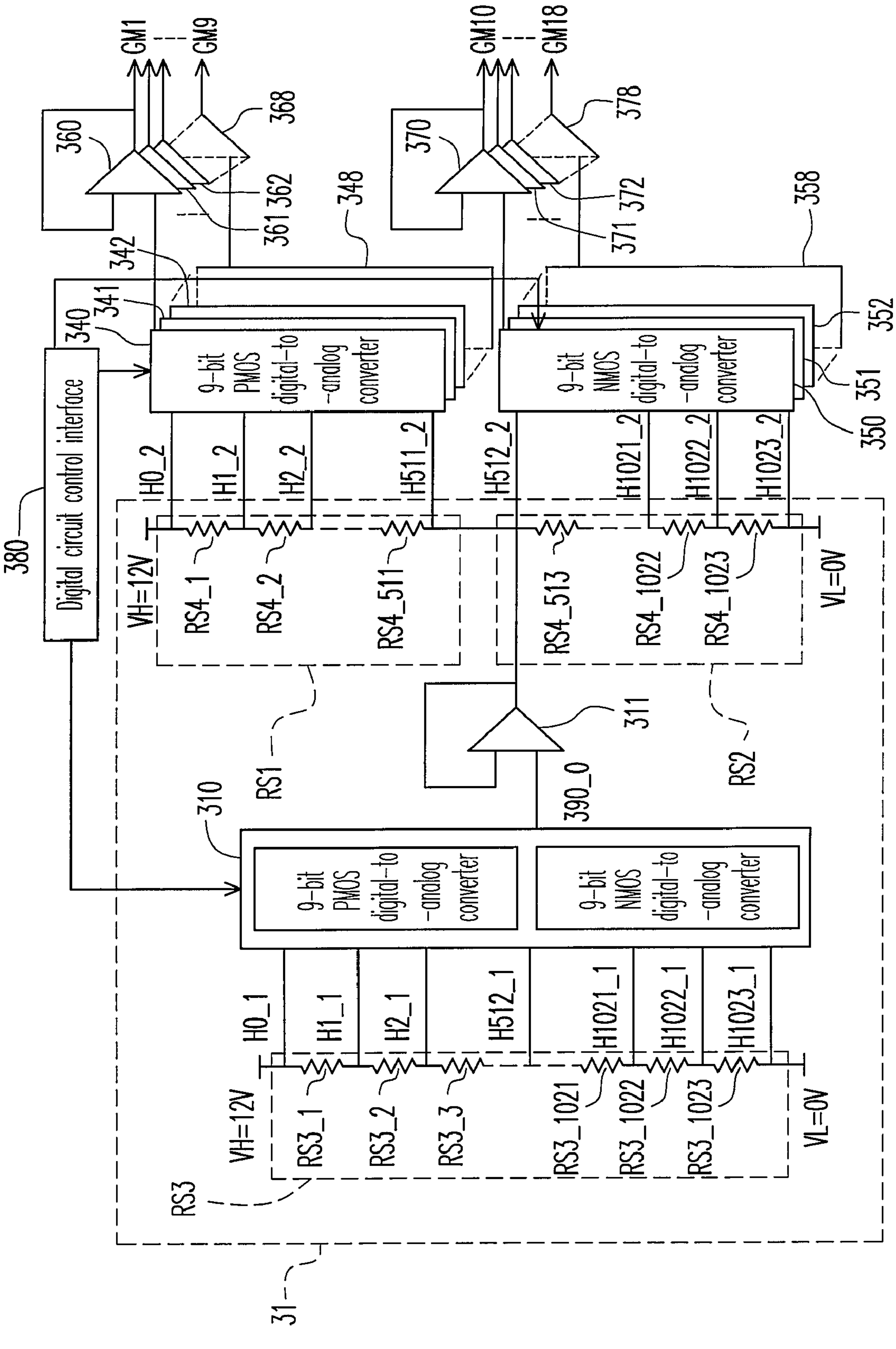
FIG. 4 is a schematic three-dimensional view of the gamma reference voltages generating circuit in FIG. 3.

FIG. 4 is a schematic three-dimensional view of the circuit in FIG. 3. In FIG. 4, the digital-to-analog converters and the output buffers are drawn in three dimensions so as to highlight their numbers. As shown in FIGS. 3 and 4, the first resistor string RS1 is used for providing 512 first supply voltages to the first digital-to-analog converters 340~348. The first digital-to-analog converters 340~348 output the second gamma reference voltages GM1~GM9 through the output buffers 360~368. The circuit operations for generating the second gamma reference voltages GM1~GM9 are as follows. The first resistor string RS1 input the 512 first supply voltages through the conductive wires H0_2~H511_2 to the first digital-to-analog converters 340~348. The digital circuit control interface (for example, the I2C interface) 380 provides control signals to the first digital-to-analog converters 340~348. The first digital-to-analog converters 340~348 individually select one of the 512 supply voltages. The voltages obtained by decoding with the control signals are input to the output buffers 360~368 through the conductive wires 390_1~390_9 so as to output the second gamma reference voltages GM1~GM9.

The second resistor string RS2 is used for providing 512 second supply voltages to the second digital-to-analog converters 350~358. The second digital-to-analog converters 350~358 output the third gamma reference voltages GM10~GM18 through the output buffers 370~378. The circuit operations for generating the third gamma reference voltages GM10~GM18 are as follows. The second resistor string RS2 input the 512 second supply voltages through the conductive wires H512_2~H1023_2 to the second digital-to-analog converters 350~358. The digital circuit control interface 380 provides control signals to the second digital-to-analog converters 350~358. The second digital-to-analog converters 350~358 individually select one of the 512 supply voltages. The voltages obtained by decoding with the control signals are input to the output buffers 370~378 through the conductive wires 390_10~390_18 so as to output the third gamma reference voltages GM10~GM18.

Thus, in the embodiment of the present invention, the output voltage range of the first digital-to-analog converters 340~348 is the second gamma reference voltages GM1~GM9 between the first gamma reference voltage Vcom and the first source voltage VH. Meanwhile, the output voltage range of the second digital-to-analog converters 350~358 is the third gamma reference voltages GM10~GM18 between the first gamma reference voltage Vcom and the second source voltage VL.

The third resistor string RS3, the third digital-to-analog converter 310 and the output buffer 311 are used for generating the first gamma reference voltage Vcom. The circuit operations for generating the first gamma reference voltage Vcom are as follows. The 1024 voltages provided by the third resistor string RS3 are input through the conductive wires H0_1~H1023_1 to the third digital-to-analog converter 310. The digital circuit control interface 380 provides a control signal to the third digital-to-analog converter 310 for decoding a voltage. The decoded voltage is input to the output buffer 311 in order to output the first gamma reference voltage Vcom.

A detailed description of the method of decoding voltage in the embodiment of the present invention is provided as follows.

If the first gamma reference voltage Vcom is connected to the conductive wire H512_2, then the decoded voltage of the second gamma reference voltage is:

$$H(K)=VH-((VH-V\mathrm{com})/512)*K,\ K=0\sim511;$$

And the decoded voltage of the third gamma reference voltage is:

$$H(K)=VL+((V\mathrm{com}-VL)/511)*(1023-K),\ K=512\sim1023;$$

If the first gamma reference voltage Vcom is connected to the conductive wire H511_2, then the decoded voltage of the second gamma reference voltage is:

$$H(K)=VH-((VH-V\mathrm{com})/511)*K,\ K=0\sim511;$$

And the decoded voltage of the third gamma reference voltage is:

$$H(K)=VL+((V\mathrm{com}-VL)/512)*(1023-K),\ K=512\sim1023$$

Because of the body effect of PMOS or NMOS, the first gamma reference voltage Vcom is limited to the voltage range 4V~8V assuming that the first source has a voltage VH=12V. In other words, the second gamma reference voltage provides the voltage range 4V~12V and the third gamma reference voltage provides the voltage range 0V~8V.

In the present invention, the digital circuit control interface 380 provides a control signal to the third digital-to-analog converter 310 for decoding and producing the first gamma reference voltage Vcom. In the present embodiment, the first gamma reference voltage has a value in the middle of the 1024 levels between the first source voltage VH and the second source voltage VL. Therefore, the second gamma reference voltage is between the first gamma reference voltage Vcom and the first source voltage VH, and only 9 9-bit PMOS digital-to-analog converters are required to serve as the corresponding first digital-to-analog converters for decoding. Similarly, only 9 9-bit NMOS digital-to-analog converters are required to serve as the second digital-to-analog converters for decoding. Therefore, the total number of 9-bit digital-to-analog converters required in the present invention is 20. Since the present invention requires 18 fewer digital-to-analog converters compared with the conventional circuit, layout area can be reduced and production cost can be reduced while the advantage of full range decoding is maintained.

Those skilled in the art would understand that the number of first and second digital-to-analog converters used in the present invention is not limited to only 9. The number of digital-to-analog converters can be greater than 9 or less than 9 according to the actual requirements. In addition, the first and the second digital-to-analog converters in the present invention are also not limited to a 9-bit configuration. The digital-to-analog converters can be designed to have an n-bit configuration according to the actual requirements. Similarly, in the present invention, the voltages provided by the voltage provider are not limited to the 1024 levels between the first source voltage VH and the second source voltage VL, but can be designed to have $2^n$ levels. For example, when n is equal to 10, there are 1024 ($2^{10}$) levels between the first source voltage VH and the second source voltage VL. When n is equal to 11, there are 2048 ($2^{11}$) levels between the first source voltage VH and the second source voltage VL. Moreover, the voltage divider circuit in the present invention is not limited to a resistor string, but can also be a circuit of capacitors or transistors. On the other hand, the first gamma reference voltage Vcom of the present invention can be set to any value between the first source voltage VH and the second source voltage VL. Furthermore, the first source voltage VH need not be restricted to 12V and the second source voltage VL need not be restricted to 0V.

Figure 5:
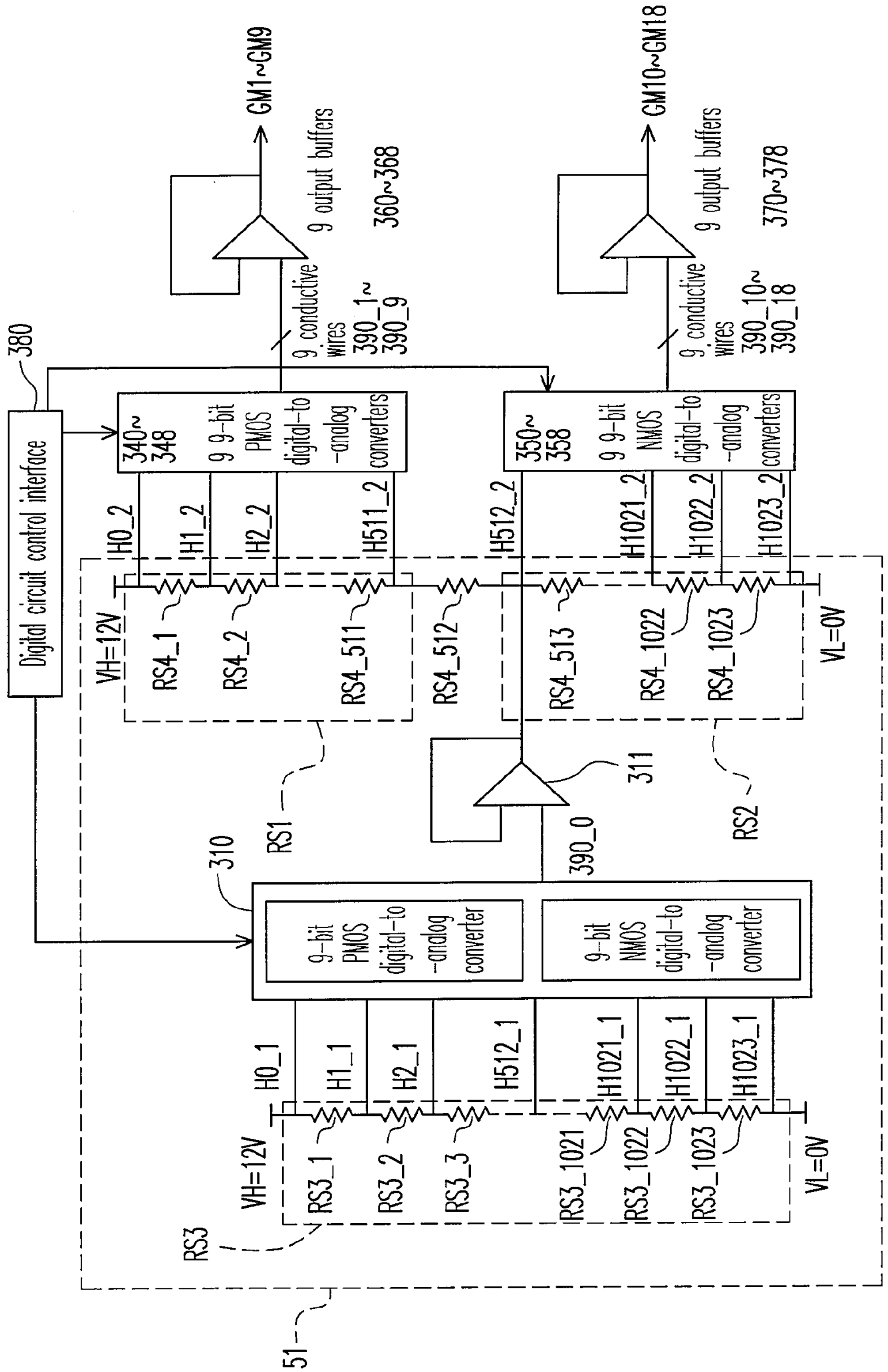
FIG. 5 is a diagram of a gamma reference voltages generating circuit according to another embodiment of the present invention.
Figure 6:
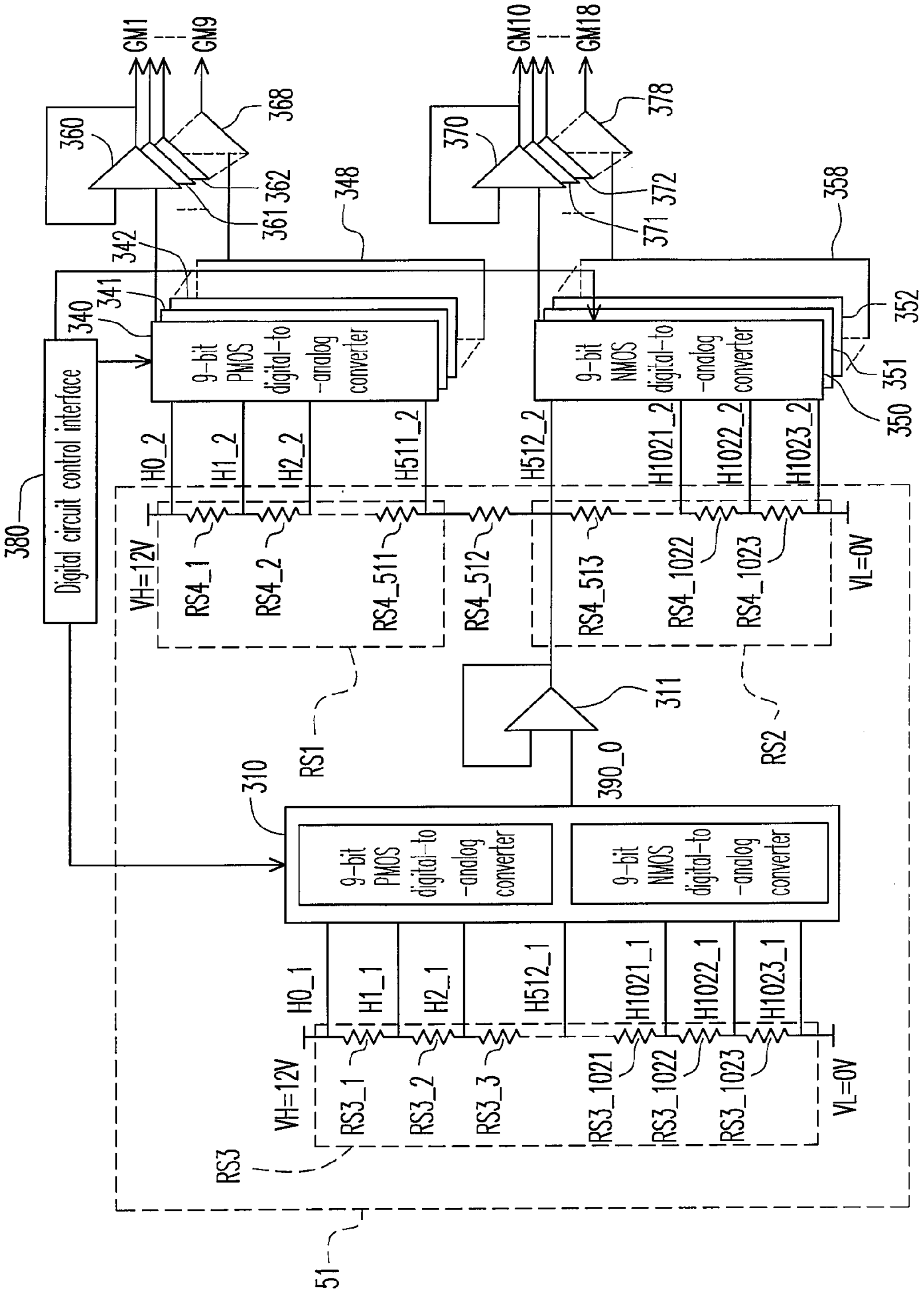
FIG. 6 is a schematic three-dimensional view of the circuit in FIG. 5.

The main difference between the gamma reference voltages generating circuit FIG. 5 from that in FIG. 3 is that an additional resistor RS4_512 is disposed between the conductive wires H511_2 and the conductive wire H512_2 inside the voltage provider 51. FIG. 6 is a schematic three-dimensional view of the circuit in FIG. 5. In FIG. 6, the digital-to-analog converters and the output buffers are drawn in three dimensions so as to highlight their numbers. With the addition of the resistor RS4_512, an overlap between the voltage provided by the first digital-to-analog converters 340~348 and the voltage provided by the second digital-to-analog converters 350~358 can be prevented.

In summary, since different digital-to-analog converter structures are provided according to the voltage range in the present invention, the required number of corresponding digital-to-analog converters is only about half that of the conventional structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit for generating gamma reference voltages, comprising:

a voltage provider, electrically coupled to a first reference voltage, and generating a plurality of first supply voltages and second supply voltages;

a plurality of first digital-to-analog converters, electrically coupled to the first supply voltages, and generating a plurality of second reference voltages; and a plurality of second digital-to-analog converters, electrically coupled to the second supply voltages, and generating a plurality of third reference voltages.

2. The circuit as claimed in claim 1, wherein the voltage provider is electrically coupled to a first power voltage and a second power voltage.

3. The circuit as claimed in claim 2, wherein the voltage provider further comprising a first sub-voltage provider and a second sub-voltage provider, the first sub-voltage provider electrically coupled to the first power voltage, the second sub-voltage provider electrically coupled to the second power voltage and the first reference voltage.

4. The circuit as claimed in claim 3, wherein the first sub-voltage provider is a resistor string, the second voltage provider is a resistor string, and the first sub-voltage provider and the second sub-voltage provider is electrically coupled.

5. The circuit as claimed in claim 2, wherein the voltage provider is a resistor string, the first power voltage and the second power voltage are electrically coupled to the two end of the resistor string, the first reference voltage electrically coupled to a terminal between the two ends of the resistor string.

6. The circuit as claimed in claim 1, further comprising a third digital-to-analog converter for generating the first reference voltage.

7. The circuit as claimed in claim 6, further comprising a first output buffer between the third digital-to-analog converter and the voltage provider.

8. The circuit as claimed in claim 7, further comprising a control circuit for providing a plurality of control signals to the first, second and third digital-to-analog converters for indicating the second reference voltages, the third reference voltages and the first reference voltage respectively.

9. The circuit as claimed in claim 1, further comprising a plurality of second output buffers and third output buffers, wherein the corresponding second output buffer is electrically coupled to the corresponding first digital-to-analog converter, the corresponding third output buffer is electrically coupled to the corresponding second digital-to-analog converter.

* * * * *